(12) United States Patent
Zheng et al.

(10) Patent No.: US 11,002,873 B2
(45) Date of Patent: May 11, 2021

(54) FLUXGATE DETECTOR FOR BURIED AND ABANDONED CHEMICAL WEAPONS

(71) Applicant: Tsinghua University, Beijing (CN)

(72) Inventors: Xiao-Ping Zheng, Beijing (CN); Li Yang, Beijing (CN); Hua Geng, Beijing (CN)

(73) Assignee: TSINGHUA UNIVERSITY, Beijing (CN)

(*) Notice: Subject to any disclaimer, the term of this patent is extended or adjusted under 35 U.S.C. 154(b) by 288 days.

(21) Appl. No.: 16/233,130

(22) Filed: Dec. 27, 2018

(65) Prior Publication Data

US 2020/0400853 A1 Dec. 24, 2020

Related U.S. Application Data

(63) Continuation of application No. PCT/CN2018/075040, filed on Feb. 2, 2018.

(30) Foreign Application Priority Data

Dec. 29, 2017 (CN) .......................... 201711483150.2

(51) Int. Cl.
*G01R 23/06* (2006.01)
*G01V 3/10* (2006.01)
*G01V 3/38* (2006.01)

(52) U.S. Cl.
CPC .............. *G01V 3/101* (2013.01); *G01V 3/105* (2013.01); *G01V 3/38* (2013.01)

(58) Field of Classification Search
CPC ... G01V 3/38; G01V 3/04; G01V 3/10; G01V 3/12; G01V 3/101; G01V 3/102;
(Continued)

(56) References Cited

U.S. PATENT DOCUMENTS

| 4,091,322 A * | 5/1978 | Stankoff | G01V 3/108 324/329 |
| 2002/0162403 A1* | 11/2002 | Cripe | G01L 3/105 73/862.333 |

(Continued)

FOREIGN PATENT DOCUMENTS

| CN | 204536516 U | 8/2015 |
| CN | 204758805 U | 11/2015 |
| CN | 106443805 A | 2/2017 |

OTHER PUBLICATIONS

Research of high accuracy digital magnetometer system based on fluxgate magnetic technique, Li Wentong, China outstanding master's degree paper full text database, Engineering Science and Technology Part II, vol. 10, chapter 3-4.
(Continued)

*Primary Examiner* — Patrick Assouad
*Assistant Examiner* — Taqi R Nasir (57) ABSTRACT

A fluxgate detector for buried and abandoned chemical weapons is provided, comprising: a probe for sensing an external magnetic field, comprising a probe input and a probe output; an excitation module electrically connected to the probe input for inputting an excitation signal into the probe; a frequency selection module electrically connected to the probe output for isolating a second harmonic signal in an induced voltage generated by the probe; and a signal acquisition module electrically connected to the frequency selection module. The second harmonic signal in the induced voltage can be isolated by the frequency selection module, transmitted to the signal acquisition module, and converted to an intensity of the magnetic field by the signal acquisition module. The substance detected can be identified according to the intensity of the magnetic field, so that the buried ACWs can be found efficiently and accurately.

8 Claims, 5 Drawing Sheets

(58) Field of Classification Search
CPC ........ G01V 3/104; G01V 3/105; G01V 3/107; G01V 3/108; G01V 3/165; G01N 27/72; G01N 27/80; G01N 27/82; G01N 27/83; G01N 27/90; G01N 27/9006; G01N 27/9013; G01N 27/902; G01N 27/9046; G01R 133/02; G01R 23/06
See application file for complete search history.

(56) References Cited

U.S. PATENT DOCUMENTS

2012/0086455 A1\* 4/2012 McAdam ............... G01V 3/107
324/326
2018/0031646 A1\* 2/2018 Tiernan ................ G01R 33/096

OTHER PUBLICATIONS

International Search report of PCT/CN2018/075040.

\* cited by examiner

FLUXGATE DETECTOR FOR BURIED AND ABANDONED CHEMICAL WEAPONS

CROSS-REFERENCE TO RELATED APPLICATIONS

This application claims all benefits accruing under 35 U.S.C. § 119 from China Patent Application No. 201711483150.2, filed on Dec. 29, 2017 in the State Intellectual Property Office of China, the content of which is hereby incorporated by reference. This application is a continuation under 35 U.S.C. § 120 of international patent application PCT/CN2018/075040 filed on Feb. 2, 2018, the content of which is also hereby incorporated by reference.

FIELD

The present disclosure relates to the field of detection, in particular to a fluxgate detector for buried and abandoned chemical weapons.

BACKGROUND

Since the end of the Second World War, huge amount of Abandoned Chemical Weapons (hereinafter to be referred as ACWs) still present in many countries pose a grave threat to people's lives and health, as well as environmental security. The ACWs were mainly buried underground (hereinafter to be referred as buried ACWs), such as in pits or caves. Now over 70 years have passed, the ACWs have corroded, which may have caused or will cause leakage of the highly toxic chemicals. Except for the high toxicity, wide distribution is another characteristic of the ACWs. So it would be of great significance to develop a detector to find the buried ACWs.

Small target of detection and depth of bury are another two characteristics of the buried ACWs. For example, calibers of chemical shells in the ACWs generally are 75 mm, 90 mm, 105 mm, and 150 mm; calibers of chemical aerial bombs in the ACWs generally are 100 mm, and 198 mm; calibers of gas bombs in the ACWs generally are 290 mm, 114 mm, and 50 mm; and calibers of toxic agent barrels in the ACWs generally are 470 mm, 400 mm, and 325 mm. Buried depths of most of the ACWs are no more than 5 meters, for example, 0 to 2 meters for falling bombs and 2 meters to 5 meters for bombs hidden in caves or tunnel. However, the ACWs were also found in an abandoned mine with a depth of 100 meters.

As mentioned above, the ACWs are continuously corroding, and materials of packaging housings of the ACWs have been transformed to rust from metal such as iron or steel. Therefore, conventional detectors used to discover chemical weapons by detecting metal are not appropriate for the ACWs.

SUMMARY

According to an aspect of the present disclosure, a fluxgate detector for buried and abandoned chemical weapons with high detection accuracy is provided.

The fluxgate detector includes a probe for sensing an external magnetic field, comprising a probe input and a probe output, an excitation module electrically connected to the probe input for inputting an excitation signal into the probe, a frequency selection module electrically connected to the probe output for isolating a second harmonic signal in an induced voltage generated by the probe, and a signal acquisition module electrically connected to the frequency selection module.

In some embodiments, the excitation module includes a waveform generation circuit and a power amplification circuit, an input of which is electrically connected to an output of the waveform generation circuit and an output of which is electrically connected to the probe input.

In some embodiments, the waveform generation circuit includes a waveform generator for generating the excitation signal to be firstly amplified by the power amplification circuit and then input into the probe.

In some embodiments, the excitation module further includes a waveform conversion circuit electrically connected between the waveform generation circuit and the power amplification circuit, the waveform generation circuit is configured to generate a square wave signal, the waveform conversion circuit is configured to convert the square wave signal to a triangular wave signal, and the power amplification circuit is configured to amplify the triangular wave signal.

In some embodiments, the excitation module further includes an isolation transformer electrically connected between the waveform conversion circuit and the power amplification circuit, including a primary coil electrically connected to the output of the waveform generation circuit, and a secondary coil electrically connected to the input of the power amplification circuit.

In some embodiments, the power amplification circuit includes a voltage follower electrically connected to the secondary coil, a pre-amplifier, and a power amplifier electrically connected sequentially.

In some embodiments, the frequency selection module includes a resonance circuit with a resonant frequency equal to a frequency of the secondary harmonic signal, an input of which is electrically connected to the probe output and an output of which is electrically connected to an input of the signal acquisition module.

In some embodiments, the frequency selection module further includes an instrumentation amplification circuit, an input of which is electrically connected to the output of the resonance circuit, and a narrowband band-pass filter circuit with a center frequency equal to the frequency of the secondary harmonic signal, an input of which is electrically connected to an output of the instrumentation amplification circuit and an output of which is electrically connected to the input of the signal acquisition module.

In some embodiments, the frequency selection module further includes a zeroing circuit electrically connected to the instrumentation amplification circuit.

In some embodiments, the signal acquisition module includes an analog-digital conversion unit for converting the second harmonic signal to a digital signal, and a signal processing unit for processing the digital signal to obtain an intensity of a magnetic field detected.

In the present disclosure, a magnetic field of a substance is sensed by the probe so as to generate the induced voltage. The second harmonic signal in the induced voltage can be isolated by the frequency selection module, transmitted to the signal acquisition module, and converted to an intensity of the magnetic field by the signal acquisition module. The substance can be identified according to the intensity of the magnetic field, so that the buried ACWs can be found efficiently and accurately.

DETAILED DESCRIPTION

For a clear understanding of the technical features, objects and effects of the present disclosure, specific embodiments of the present disclosure will now be described in detail with reference to the accompanying drawings. It is to be understood that the following description is merely exemplary embodiments of the present disclosure, and is not intended to limit the scope of the present disclosure.

Figure 1:
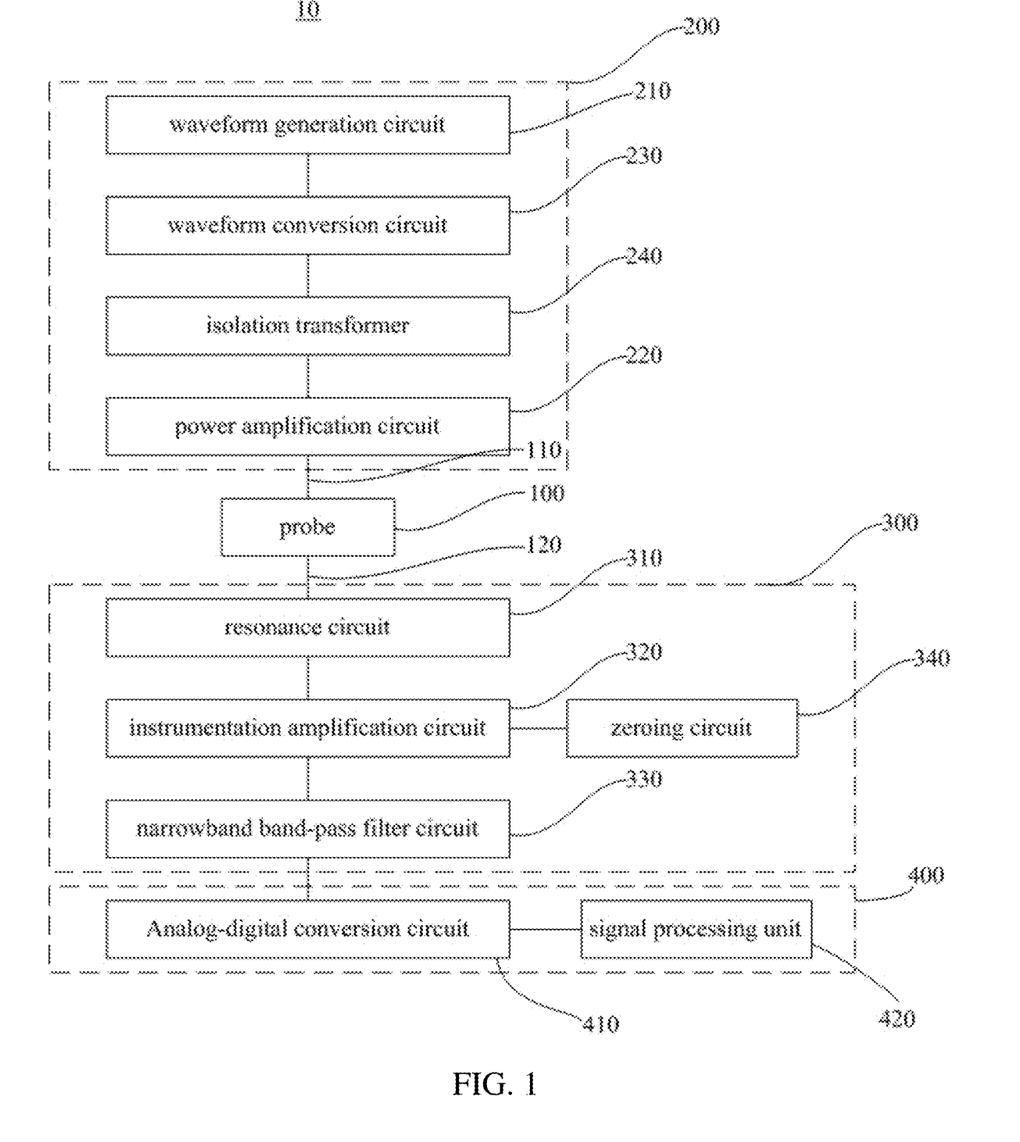
FIG. 1 is a module diagram of one embodiment of a fluxgate detector for buried and abandoned chemical weapons.
Figure 2:
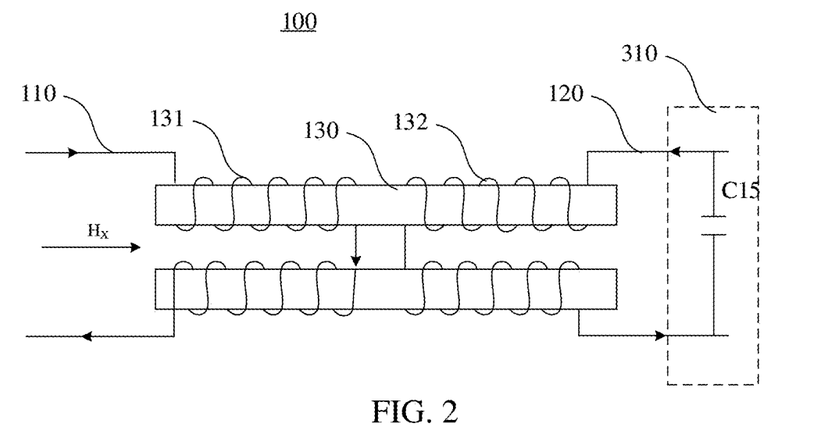
FIG. 2 is a schematic diagram of one embodiment of a detector.

Referring to FIG. 1 and FIG. 2, in one embodiment, a fluxgate detector 10 for the buried ACWs is provided, comprising a probe 100, an excitation module 200, a frequency selection module 300, and a signal acquisition module 400. The probe 100 can include a probe input 110 and a probe output 120. The probe 100 is configured for sensing an external magnetic field. The excitation module 200 can be electrically connected to the probe input 110 for inputting an excitation signal into the probe 100. The frequency selection module 300 can be electrically connected to the probe output 120 for isolating a second harmonic signal in an induced voltage generated by the probe 100. The signal acquisition module 400 can be electrically connected to the frequency selection module 300.

A differential structure can be used in the probe 100. The probe 100 can include two magnetic cores 130 substantially parallel to and spaced from each other. Each of the two magnetic cores 130 can have a first end and a second end opposite to the first end. The first ends of the two magnetic cores 130 can be disposed correspondingly to each other and both winded by an excitation coil 131. The second ends of the two magnetic cores 130 can be disposed correspondingly to each other and both winded by an induction coil 132. The induction coil 132 can be used as or electrically connected to the probe output 120. The two magnetic cores 130 can be made of a cobalt-based amorphous magnetically soft alloy material which has advantages of high magnetic conductivity, low coercive force, and low saturation magnetization.

The excitation module 200 can input the excitation signal into the probe 100 via the excitation coil 131. The excitation signal can be an alternating magnetic field signal. Internal magnetic field intensities of the two magnetic cores 130 are respectively equal to a sum of an intensity of a magnetic field detected and an intensity of the alternating magnetic field. When the intensity of the magnetic field detected is not equal to zero, an induced voltage associated with the magnetic field detected is induced in the induction coil 132. Due to the modulation of the magnetic conductivity, a second harmonic component of the induced voltage is proportional to the intensity of the magnetic field detected. Therefore, information of the magnetic field detected can be obtained by detecting the second harmonic signal. The induced voltage can be input into the frequency selection module 300 via the probe output 120 and processed by the frequency selection module 300 to isolate the second harmonic signal. The second harmonic signal isolated can be captured and processed by the signal acquisition module 400, and consequently the intensity of the magnetic field detected can be obtained. A substance detected can be identified according to the intensity of the magnetic field detected, so as to decide whether there are the ACWs. By detecting the second harmonic signal of the induced voltage to acquire the intensity of the magnetic field detected and identify the substance detected, the ACWs can be detected accurately to avoid omission.

Figure 3:
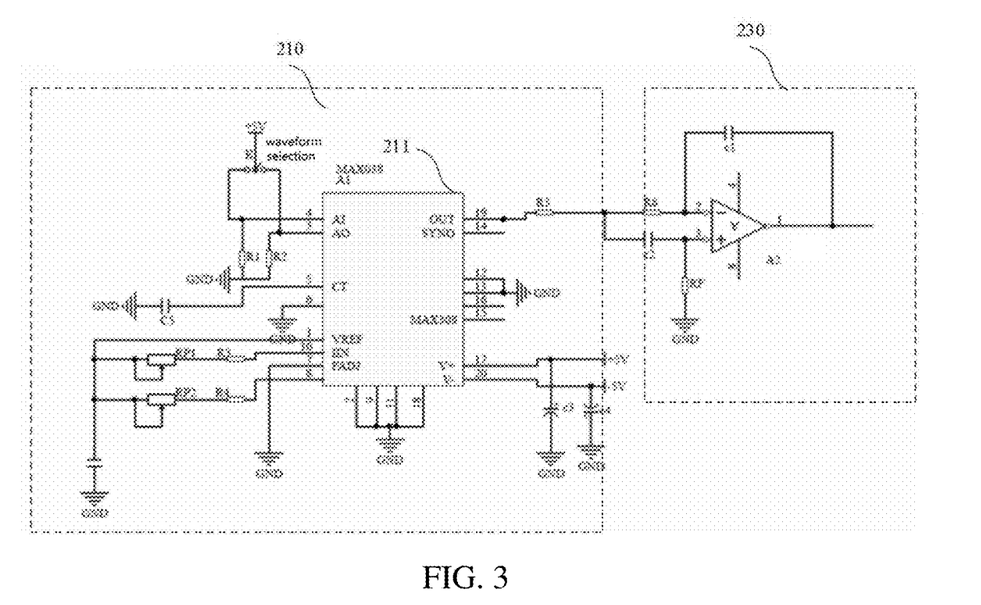
FIG. 3 is a diagram of one embodiment of a waveform generation circuit and a waveform conversion circuit.
Figure 4:
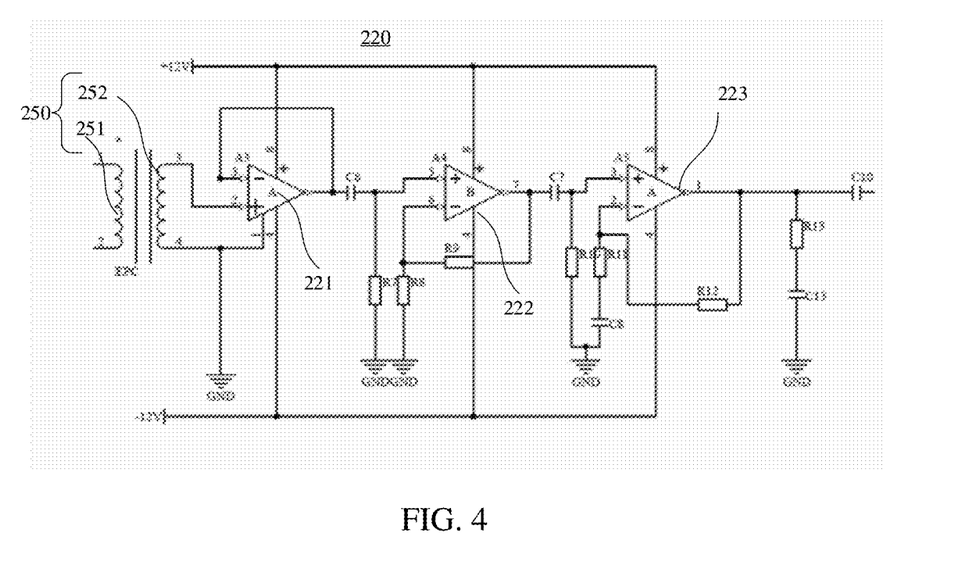
FIG. 4 is a diagram of one embodiment of a power amplification circuit.

Referring to FIG. 3 and FIG. 4, in some embodiments, the excitation module 200 can include a waveform generation circuit 210 and a power amplification circuit 220. An input of the power amplification circuit 220 can be electrically connected to an output of the waveform generation circuit 210. An output of the power amplification circuit 220 can be electrically connected to the probe input 110. The waveform generation circuit 210 is configured to generate a square wave signal or a triangular wave signal. The triangular wave signal can be input into the probe 100 as the excitation signal. The square wave signal can be firstly converted to a triangular wave signal and then input into the probe 100.

In some embodiments, the waveform generation circuit 210 can include a waveform generator 211. The waveform generator 211 is configured to generate the excitation signal. The excitation signal can be firstly amplified by the power amplification circuit 220 and then input into the probe 100. The waveform generator 211 can be a function generator such as the MAX038. The MAX038 is a high-frequency, precision function generator producing sine wave, square wave, triangular wave, and the like. The MAX038 has advantages such as wide frequency range, smaller temperature drift, and good linearity.

The waveform generation circuit 210 can further include a potentiometer RP2 and a resistor R4 which are electrically connected in series between a first ground lead and a pin 8 of the function generator. The waveform generation circuit 210 can further include a potentiometer RP1 and a resistor R3 which are electrically connected in series between a second ground lead and a pin 10 of the function generator. Pins 6 and 7 of the function generator can be grounded. A frequency of the wave signal output by the waveform generator 211 can be adjusted by regulating the potentiometer RP1. A capacitor C5 can be electrically connected between a pin 5 of the function generator and a third ground lead. The capacitor C5 can be charged and discharged by inputting constant current $I_{in}$ via the pin 7 to form oscillation, thereby generating the triangular wave signal or the square signal. A pin 3 of the function generator can be electrically connected to a resistor R2, a pin 4 of the function generator can be electrically connected to resistor R1, and the resistor R2 and the resistor R1 can be both electrically connected to a fourth ground lead. The pin 3 and pin 4 can further be respectively and electrically connected to waveform selection switch K. By changing the status of the waveform selection switch K, waves with different waveforms can be output from a pin 19 of the function generation.

In some embodiments, the excitation module 200 can further include a waveform conversion circuit 230 configured to convert the square wave signal to a sharp wave signal, such as a triangular wave signal. The waveform conversion circuit 230 can be electrically connected between the waveform generation circuit 210 and the power amplification circuit 220. The waveform generation circuit 210 can be used to generate the square wave signal. The square wave signal can be processed by the waveform conversion circuit 230 to generate the triangular wave signal. The triangular wave signal can be amplified by the power amplification circuit 220.

The waveform conversion circuit 230 can include an operational amplifier A2, a resistor R6, a capacitor C2, and a capacitor C1. The resistor R6 can be respectively and electrically connected to an inverting input of the operational amplifier A2 and a resistor R5 of the waveform generation circuit 210. The capacitor C2 can be respectively and electrically connected to a non-inverting input of the operational amplifier A2 and the resistor R5. The resistor R5 can be further electrically connected to the pin 19 of the function generator. The capacitor C1 can be respectively and electrically connected to the inverting input of the operational amplifier A2 and an output of the operational amplifier A2. The non-inverting input of the operational amplifier A2 can be further grounded via a resistor RF. A rate time constant of the waveform conversion circuit 230 is decided by a product of a capacitor value of capacitor C2 and a resistor value of the resistor RF. An integral time constant waveform conversion circuit 230 is decided by a product of a capacitor value of capacitor C1 and a resistor value of the resistor R6. The triangular wave signal can be output from the operational amplifier A2. An error caused by remanence can be decreased by the triangular wave signal, thereby improving the excitation effect and increasing the accuracy of the detector 10.

Referring to FIG. 4, in some embodiments, an isolation transformer 250 can be electrically connected between the waveform conversion circuit 230 and the power amplification circuit 220. The isolation transformer 250 can include a primary coil 251 and a secondary coil 252. The primary coil 251 can be electrically connected to the output of the waveform generation circuit 210. The secondary coil 252 can be electrically connected to an input of the power amplification circuit 220. The isolation transformer 250 is used for electrical isolation.

In some embodiments, the power amplification circuit 220 can include a voltage follower 221, a pre-amplifier 222, and a power amplifier 223 which are sequentially and electrically connected. The secondary coil 252 can be electrically connected to the voltage follower 221. Two ends of the secondary coil 252 can be respectively and electrically connected to the voltage follower 221. The pre-amplifier 222 can be used to amplify a voltage. An inverting input of the voltage follower 221 can be electrically connected to an output of the voltage follower 221. The output of the voltage follower 221 can be grounded via a coupling capacitor C6 and a resistor R7. The output of the voltage follower 221 can be further electrically connected to a non-inverting input of the pre-amplifier 222 via the coupling capacitor C6. The inverting input of the pre-amplifier 222 can be grounded via a resistor R8. The non-inverting input of the pre-amplifier 222 and the output of the pre-amplifier 222 can be electrically connected to each other via a resistor R9. The output of the pre-amplifier 222 can be electrically connected to a non-inverting input of the power amplifier 223 via a coupling capacitor C7. The coupling capacitor C7 can be grounded via a resistor R10. An inverting input of the power amplifier 223 can be grounded via a resistor R11 and a coupling capacitor C8. The inverting input of the power amplifier 223 can be further electrically connected to the output of the power amplifier 223 via a resistor R12. The output of the power amplifier 223 can be grounded via a resistor R13 and a capacitor C13 that are sequentially and electrically connected. The resistor R13 and the capacitor C13 can be used to suppress a high frequency noise. The output of the power amplifier 223 outputs a power amplified signal via a capacitor C10. The capacitor C10 has functions of filtering and blocking. The power amplifier 223 can be a LM1875 chip.

In some embodiments, the frequency selection module 300 can include a resonance circuit 310. An input of the resonance circuit 310 can be electrically connected to the probe output 120. A resonant frequency of the resonance circuit 310 can equal to a frequency of the second harmonic signal. The second harmonic signal output by the resonance circuit 310 can be input into and processed by the signal acquisition unit. The resonance circuit 310 can include a capacitor C15 electrically connected across the induction coil. The resonance circuit 310 can be an RLC resonance circuit 310.

Figure 5:
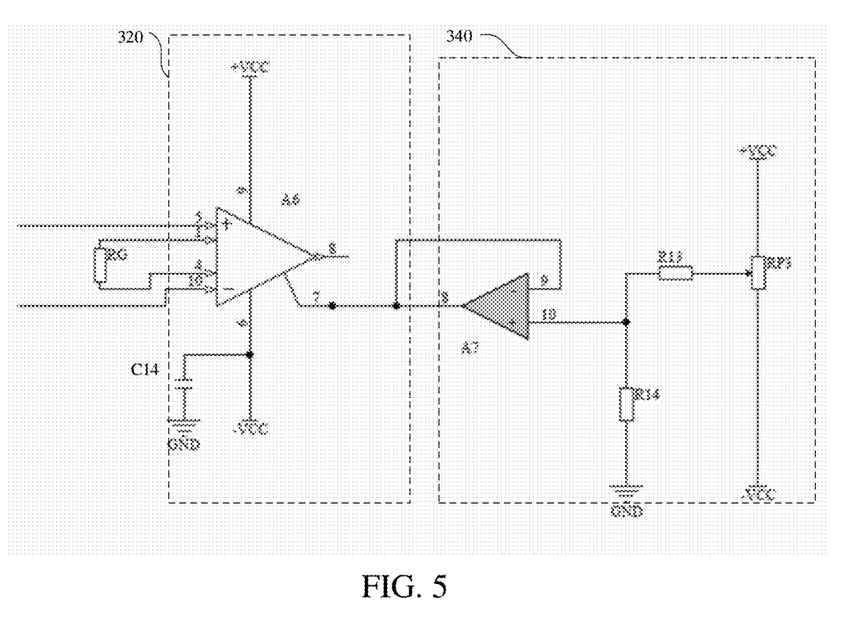
FIG. 5 is a diagram of one embodiment of an instrumentation amplification circuit and a zeroing circuit.
Figure 6:
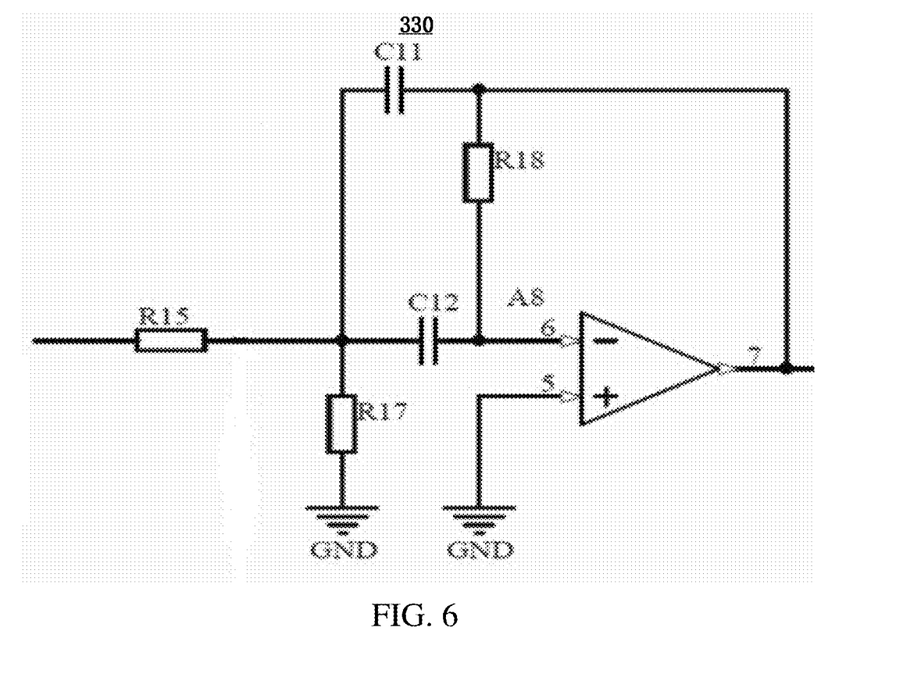
FIG. 6 is a diagram of one embodiment of a narrowband band-pass filter circuit.

Referring to FIG. 5 and FIG. 6, in some embodiments, the frequency selection module 300 can include an instrumentation amplification circuit 320 and a narrowband band-pass filter circuit 330. An input of the instrumentation amplification circuit 320 can be electrically connected to an output of the resonance circuit 310. A center frequency of the narrowband band-pass filter circuit 330 can be equal to the frequency of the second harmonic signal. The input of the pre-amplifier 222 can be electrically connected to an input of the narrowband band-pass filter circuit 330. The second harmonic signal outputted by the resonance circuit 310 can be firstly input into and amplified by the instrumentation amplification circuit 320, then input into and filtered by the narrowband band-pass filter circuit 330, and finally input into and processed by the signal collecting unit. The instrumentation amplification circuit 320 can include an instrumentation amplifier A6 having a low noise and a low offset. The instrumentation amplifier A6 can include a chip INA101M. The chip INA101M can include two operational amplifiers electrically connected as non-inverting structure and an operational amplifier electrically connected as differential structure, which is advantageous for further suppressing the noise signal output by the probe 100. The instrumentation amplifier A6 can be electrically connected with a resistor RG. A voltage amplification factor of the instrumentation amplifier A6 can be equal to (1+40K/RG). An amplification factor of the instrumentation amplification circuit 320 can be regulated by adjusting a resistor value of the resistor RG.

Referring to FIG. 6, the narrowband band-pass filter circuit 330 can be an active filter circuit such as an infinite gain multiloop feedback type. The narrowband band-pass filter circuit 330 can include an operational amplifier A8. An inverting input of the operational amplifier A8 can be sequentially and electrically connected to a capacitor C12 and a resistor R15. One end of a capacitor C11 can be electrically connected between the capacitor C12 and the resistor R15. The other end of the capacitor C11 can be electrically connected to an output of the operational amplifier A8 and further electrically connected between the capacitor C12 and the inverting output of the operational amplifier A8 via a resistor R18. One end of a resistor R17 can be electrically connected between the resistor R15 and the capacitor C12, and the other end of the resistor R17 can be grounded. The resistor R15 is configured to electrically connect with the output of the instrumentation amplification circuit 320. The center frequency $w_0$ of the narrowband band-pass filter circuit 330 is determined by value of C11, C12, R17, and R18 according to the following equations:

$$\omega_0 = \sqrt{\frac{1}{R_{18}C_{12}C_{11}}\left(\frac{1}{R_{15}} + \frac{1}{R_{17}}\right)}.$$

As can be seen from the equation, by introducing the resistor 18, the multiloop feedback filter circuit 330 can be obtained, thereby improving the quality of signal.

In some embodiments, the frequency selection module 300 can further include a zeroing circuit 340. The zeroing circuit 340 can be electrically connected to a zeroing interface of the instrumentation amplification circuit 320. The zeroing circuit 340 is configured to reset the instrumentation amplification circuit 320 to zero, so that an accuracy of the signal output can be improved. The zeroing circuit 340 can further include an operational amplifier A7. An inverting input of the operational amplifier A7 can be electrically connected to the zeroing interface of the instrumentation amplifier A6 and an output of the operational amplifier A7 respectively. A non-inverting input of the operational amplifier A7 can be respectively grounded via a resistor R14 and electrically connected to a power source via resistors R13 and RP3.

In some embodiments, the signal acquisition module 400 can include an analog-digital conversion unit 410 for converting the second harmonic signal to a digital signal and a signal processing unit 420 for processing the digital signal to obtain the intensity of the magnetic field detected.

It will be understood that when an element is referred to as being "connected" or "coupled" to another element, it can be directly connected or coupled to the other element or intervening elements may be present. In contrast, if an element is referred to as being "directly connected" or "directly coupled" to another element, there are no intervening elements present. The terms "vertical", "horizontal", "left" and "right" and other similar expressions used herein is for the purpose of describing particular embodiments only and is not intended to be limiting of the invention.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A fluxgate detector for buried and abandoned chemical weapons, comprising:
   a probe for sensing an external magnetic field, comprising a probe input and a probe output;
   an excitation module electrically connected to the probe input, for inputting an excitation signal into the probe;
   a frequency selection module electrically connected to the probe output, for detecting a second harmonic signal in an induced voltage generated by the probe; and
   a signal acquisition module electrically connected to the frequency selection module;
   wherein the excitation module comprises:
      a waveform generation circuit;
      a power amplification circuit, an input of the power amplification circuit being electrically connected to an output of the waveform generation circuit, and an output of the power amplification circuit being electrically connected to the probe input;
      a waveform conversion circuit for conversing a square wave to a sharp triangular wave, the waveform conversion circuit being electrically connected between the waveform generation circuit and the power amplification circuit; and
      an isolation transformer electrically connected between the waveform conversion circuit and the power amplification circuit;
   wherein the excitation signal generated by the waveform generation circuit is a square wave signal, the waveform conversion circuit processes the square wave signal to generate a sharp triangular wave signal, and the power amplification circuit amplifies the sharp triangular wave signal;
   the isolation transformer comprises:
      a primary coil electrically connected to the output of the waveform generation circuit; and
      a secondary coil electrically connected to the input of the power amplification circuit;
   the power amplification circuit comprises a voltage follower, a pre-amplifier, and a power amplifier which are electrically and sequentially connected, and the voltage follower is electrically connected to the secondary coil;
   the frequency selection module comprises:
      a resonance circuit, an input of the resonance circuit being connected to the probe output, a resonant frequency of the resonance circuit being equal to a second harmonic frequency of the excitation signal, and the second harmonic signal output from the resonance circuit being input into the signal acquisition module to be processed;
      an instrumentation amplification circuit, an input of the instrumentation amplification circuit being electrically connected to the output of the resonance circuit; and
      a narrowband band-pass filter circuit, a center frequency of the narrowband band-pass filter circuit being equal to the second harmonic frequency of the excitation signal, an input of the pre-amplifier being electrically connected to an input of the narrowband band-pass filter circuit;
   wherein before being input into the signal acquisition module to be processed, the second harmonic signal output from the resonance circuit is input into the instrumentation amplification circuit to amplify the voltage and then input into the narrowband band-pass filter circuit to be filtered.

2. The fluxgate detector of claim 1, wherein the waveform generation circuit comprises:
   a waveform generator configured to generate the excitation signal to be firstly amplified by the power amplification circuit and then input into the probe.

3. The fluxgate detector of claim 1, wherein the waveform conversion circuit comprises:
   a first operational amplifier;
   a sixth resistor, one end of the sixth resistor being electrically connected to an inverting input of the first operational amplifier, and the other end of the sixth resistor being electrically connected to an output of the waveform generation circuit;
   a second capacitor, one end of the second capacitor being electrically connected to a non-inverting input of the first operational amplifier, and the other end of the second capacitor being electrically connected to the output of the waveform generation circuit;
   a first capacitor, one end of the first capacitor being electrically connected to the inverting input of the first operational amplifier, and the other end of the first capacitor being electrically connected to an output of the first operational amplifier; and
   a nineteenth resistor, one end of the nineteenth resistor being grounded, and the other end of the nineteenth resistor being electrically connected between the second capacitor and the non-inverting input of the first operational amplifier.

4. The fluxgate detector of claim 1, wherein the narrow-band band-pass filter circuit comprises:
   a second operational amplifier, a non-inverting input of the second operational amplifier being grounded;
   a twelfth capacitor, one end of the twelfth capacitor being electrically connected to an inverting input of the second operational amplifier, and the other end of the twelfth capacitor being electrically connected to an output of the instrumentation amplification circuit;
   an eleventh capacitor, one end of the eleventh capacitor being electrically connected between the twelfth capacitor and the output of the instrumentation amplification circuit and grounded, and the other end of the eleventh capacitor being electrically connected to an output of the second operational amplifier; and
   an eighteenth resistor, one end of the eighteenth resistor being electrically connected between the eleventh capacitor and the output of the instrumentation amplification circuit, and the other end of the resistor R18 being electrically connected between the twelfth capacitor and the inverting input of the second operational amplifier.

5. The fluxgate detector of claim 1, wherein the frequency selection module further comprises a zeroing circuit electrically connected to the instrumentation amplification circuit.

6. The fluxgate detector of claim 1, wherein the signal acquisition module comprises:
   an analog-digital conversion unit for converting the second harmonic signal to a digital signal; and
   a signal processing unit for processing the digital signal to obtain an intensity of a magnetic field detected.

7. The fluxgate detector of claim 1, wherein the probe includes two magnetic cores substantially parallel to and spaced from each other; each of the two magnetic cores has a first end and a second end opposite to the first end; the first ends of the two magnetic cores are disposed correspondingly to each other and both winded by an excitation coil; and the second ends of the two magnetic cores are disposed correspondingly to each other and both winded by an induction coil.

8. The fluxgate detector of claim 1, wherein the excitation module is configured to output an alternating magnetic field signal.

* * * * *